United States Patent
Bose et al.

(10) Patent No.: US 9,392,317 B2
(45) Date of Patent: Jul. 12, 2016

(54) SET TOP BOX OR SERVER HAVING SNAP-IN HEAT SINK AND SMART CARD READER

(75) Inventors: William Hofmann Bose, Indianapolis, IN (US); Mickey Jay Hunt, Camby, IN (US)

(73) Assignee: Thomson Licensing, Issy les Moulineaux (FR)

( * ) Notice: Subject to any disclaimer, the term of this patent is extended or adjusted under 35 U.S.C. 154(b) by 182 days.

(21) Appl. No.: 14/002,749

(22) PCT Filed: Mar. 7, 2012

(86) PCT No.: PCT/US2012/028000
§ 371 (c)(1),
(2), (4) Date: Sep. 3, 2013

(87) PCT Pub. No.: WO2012/122230
PCT Pub. Date: Sep. 13, 2012

(65) Prior Publication Data
US 2013/0347051 A1    Dec. 26, 2013

Related U.S. Application Data

(60) Provisional application No. 61/464,829, filed on Mar. 9, 2011, provisional application No. 61/464,965, filed on Mar. 11, 2011.

(51) Int. Cl.
*H04N 21/418* (2011.01)
*H04N 21/426* (2011.01)
*H05K 7/20* (2006.01)

(52) U.S. Cl.
CPC ........... *H04N 21/418* (2013.01); *H04N 21/426* (2013.01); *H05K 7/20509* (2013.01)

(58) Field of Classification Search
CPC ............. G06K 7/0021; H01L 23/3672; H01L 23/49855; H01L 2924/0002; H01L 2924/00; H05K 7/20; H05K 7/20445; H04N 21/418
USPC .................. 361/690, 692, 704, 719; 165/185; 725/151
See application file for complete search history.

(56) References Cited

U.S. PATENT DOCUMENTS 4,887,147 A    12/1989    Friedman
5,091,618 A *  2/1992     Takahashi ............ G06K 7/0021
                                              235/441

(Continued)

FOREIGN PATENT DOCUMENTS

CN    1814339         8/2006
CN    1826046 A       8/2006

(Continued)

OTHER PUBLICATIONS

Kihara; Infrared Sheds Light on New Uses for Remote Units; Aug. 1, 1990; Jee Journal of Electronic Engineering, Dempa Publications Inc., Tokyo, JP; vol. 27, No. 284, pp. 58-60.

(Continued)

*Primary Examiner* — Anthony Haughton
*Assistant Examiner* — Matt Dhillon
(74) *Attorney, Agent, or Firm* — Brian J. Dorini; Jerome G. Schaefer

(57) ABSTRACT

An electronic device is provided that comprises a bottom frame portion; an information card reader over the bottom frame portion; a thermal insulation layer; a circuit board over the thermal insulation layer; a top broad heat sink over the circuit board; and a top cover over the top broad heat sink.

14 Claims, 10 Drawing Sheets

(56) References Cited

U.S. PATENT DOCUMENTS

| | | | |
|---|---|---|---|
| 5,402,309 A | 3/1995 | Ohgami et al. | |
| 5,620,242 A | 4/1997 | Leon et al. | |
| 5,667,397 A * | 9/1997 | Broschard, III | G06K 7/0069 439/188 |
| 5,691,878 A | 11/1997 | Ahn et al. | |
| 5,917,236 A | 6/1999 | Leader, III et al. | |
| 6,021,044 A | 2/2000 | Neville, Jr. et al. | |
| 6,025,991 A | 2/2000 | Saito | |
| 6,049,469 A | 4/2000 | Hood et al. | |
| 6,212,074 B1 * | 4/2001 | Gonsalves | H01L 23/4006 165/185 |
| 6,223,815 B1 | 5/2001 | Shibasaki | |
| 6,317,325 B1 | 11/2001 | Patel et al. | |
| 6,382,995 B1 * | 5/2002 | Bricaud | H01R 13/635 439/159 |
| 6,411,507 B1 | 6/2002 | Akram | |
| 6,454,607 B2 * | 9/2002 | Bricaud | H01R 13/2442 439/180 |
| 6,524,361 B1 | 2/2003 | Thornton et al. | |
| 6,567,360 B1 | 5/2003 | Kagawa | |
| 6,593,673 B1 | 7/2003 | Sugai et al. | |
| 6,655,590 B1 * | 12/2003 | McFeely | G06K 7/0069 235/441 |
| 6,672,514 B1 * | 1/2004 | Brennan | G06K 7/0021 235/441 |
| 6,735,085 B2 | 5/2004 | McHugh et al. | |
| 6,881,077 B2 | 4/2005 | Throum | |
| 7,050,305 B2 | 5/2006 | Thorum | |
| 7,158,380 B2 | 1/2007 | Green et al. | |
| 7,187,553 B2 | 3/2007 | Schmidberger | |
| 7,203,065 B1 * | 4/2007 | Sin Yan Too | H01L 23/4006 165/104.33 |
| 7,215,551 B2 | 5/2007 | Wang | |
| 7,265,984 B2 | 9/2007 | Numata | |
| 7,350,705 B1 * | 4/2008 | Frederick | G06K 7/0021 235/439 |
| 7,362,578 B2 | 4/2008 | Hornung | |
| 7,450,387 B2 | 11/2008 | Cheng et al. | |
| 7,518,875 B2 | 4/2009 | Desrosiers et al. | |
| 7,791,874 B2 | 9/2010 | Reents et al. | |
| 7,839,630 B2 * | 11/2010 | Hwang | G06F 1/203 165/104.33 |
| D631,449 S | 1/2011 | Ritter et al. | |
| 7,961,471 B2 | 6/2011 | Odanaka et al. | |
| 8,009,426 B2 | 8/2011 | Ahmad-Taylor et al. | |
| 8,278,880 B2 | 10/2012 | Nakajima et al. | |
| 8,620,162 B2 * | 12/2013 | Mittleman | H04M 1/0202 340/815.42 |
| 8,701,279 B2 * | 4/2014 | Filson | G06F 1/1601 29/830 |
| 8,766,093 B2 * | 7/2014 | Lee | H05K 9/006 174/50 |
| 8,773,858 B2 * | 7/2014 | Burns | H04N 5/65 174/548 |
| 8,902,588 B2 | 12/2014 | Ritter et al. | |
| 9,007,773 B2 | 4/2015 | Warren et al. | |
| 2001/0026441 A1 | 10/2001 | Nakamura | |
| 2002/0039286 A1 | 4/2002 | Frank, Jr. et al. | |
| 2002/0051338 A1 | 5/2002 | Jiang et al. | |
| 2002/0154487 A1 | 10/2002 | Weischhoff Van Rijn | |
| 2003/0178627 A1 | 9/2003 | Marchl et al. | |
| 2005/0111195 A1 | 5/2005 | Wu | |
| 2005/0128710 A1 | 6/2005 | Beitelmal et al. | |
| 2005/0248923 A1 | 11/2005 | Hsu | |
| 2006/0067054 A1 | 3/2006 | Wang et al. | |
| 2006/0148295 A1 | 7/2006 | Reents et al. | |
| 2006/0181859 A1 | 8/2006 | Thorum | |
| 2006/0187643 A1 | 8/2006 | Tsurufusa | |
| 2006/0187645 A1 | 8/2006 | Numata | |
| 2006/0215357 A1 * | 9/2006 | Green | G06F 1/20 361/678 |
| 2007/0053513 A1 | 3/2007 | Hoffberg | |
| 2007/0058336 A1 | 3/2007 | Cheng | |
| 2007/0177356 A1 | 8/2007 | Panek | |
| 2008/0280482 A1 * | 11/2008 | Huang | G06K 7/0021 439/485 |
| 2009/0148638 A1 | 6/2009 | Kishi et al. | |
| 2010/0073881 A1 | 3/2010 | Williams | |
| 2010/0097768 A1 | 4/2010 | Ishii et al. | |
| 2011/0205710 A1 | 8/2011 | Kondo et al. | |
| 2012/0140417 A1 * | 6/2012 | Aspas Puertolas | H05K 7/2049 361/709 |
| 2012/0243166 A1 * | 9/2012 | Burton | H05K 7/20409 361/679.31 |
| 2012/0243176 A1 | 9/2012 | Ritter et al. | |
| 2013/0063895 A1 * | 3/2013 | Ritter | H01L 23/36 361/692 |
| 2013/0347051 A1 | 12/2013 | Bose et al. | |

FOREIGN PATENT DOCUMENTS

| | | |
|---|---|---|
| CN | 1917755 A | 2/2007 |
| CN | 201352820 | 11/2009 |
| CN | 201515429 | 6/2010 |
| CN | 201571126 | 9/2010 |
| DE | 202005013758 | 1/2006 |
| EP | 0399763 B1 | 3/1997 |
| EP | 1248507 | 10/2002 |
| EP | 1511314 A1 | 3/2005 |
| EP | 1610600 | 12/2005 |
| EP | 1990756 A2 | 12/2008 |
| FR | 2875917 | 9/2004 |
| FR | 2871022 | 12/2005 |
| GB | 2355017 | 4/2001 |
| GB | 2436170 | 9/2007 |
| JP | 129349 | 8/1986 |
| JP | 06227553 | 8/1994 |
| JP | 7-86471 A | 3/1995 |
| JP | 07059124 | 3/1995 |
| JP | 10004281 | 1/1998 |
| JP | H10-65385 A | 3/1998 |
| JP | 10-154390 | 6/1998 |
| JP | 11233982 | 8/1999 |
| JP | 2000-269671 A | 9/2000 |
| JP | 2000269675 | 9/2000 |
| JP | 2001147061 | 5/2001 |
| JP | 2001284748 | 10/2001 |
| JP | 2001358482 | 12/2001 |
| JP | 2002134970 | 5/2002 |
| JP | 2002324989 | 11/2002 |
| JP | 2003017143 | 1/2003 |
| JP | 2004186294 | 7/2004 |
| JP | 2004363525 | 12/2004 |
| JP | 2005-005424 A2 | 1/2005 |
| JP | 2005-078642 A | 3/2005 |
| JP | 2007208123 | 8/2007 |
| JP | 2008034474 | 2/2008 |
| JP | 2008-131512 A | 6/2008 |
| JP | 2009141160 | 6/2009 |
| WO | WO2007089321 | 8/2007 |
| WO | WO2007109216 | 9/2007 |
| WO | WO2009057124 | 5/2009 |
| WO | WO2010118971 | 10/2010 |
| WO | 2011/071516 A1 | 6/2011 |
| WO | 2011/106082 A1 | 9/2011 |
| WO | 2011/146302 A1 | 11/2011 |
| WO | 2011146302 | 11/2011 |

OTHER PUBLICATIONS

McDermott; Remote-Control Transmitter/Receiver Chips Exhibit Enhanced Capabilities, Mar. 1, 1982, E.D.N. Electrical Design News, vol. 27, No. 5, pp. 71-74.

\* cited by examiner

SET TOP BOX OR SERVER HAVING SNAP-IN HEAT SINK AND SMART CARD READER

CROSS-REFERENCE TO RELATED APPLICATIONS

This application claims the benefit, under 35 U.S.C. §365 of International Application PCT/US2012/028000, filed Mar. 7, 2012, which was published in accordance with PCT Article 21(2) on Sep. 13, 2012 in English and which claims the benefit of U.S. provisional patent application No. 61/464,829, filed Mar. 9, 2011 and U.S. provisional patent application No. 61/464,965, filed Mar. 11, 2011.

FIELD OF THE INVENTION

The invention relates to a set top box and, in particular, to a set top box having a snap-in heat sink and a smart card reader.

BACKGROUND

Thermal management remains a significant challenge in set top boxes in general. In fact, with the introduction of more components such as smart card readers and increased functionalities, which tend to introduce more heat that needs to be dissipated, the need for an improved thermal management system continues.

An additional complication in set top boxes is the ever increasing need to miniaturize or reduce the size of set top boxes due to consumer preference. This trend for compactness also makes thermal management a challenge, because this greater compactness with the increase in the number of internal components and functionalities concentrates heat.

An additional problem in set top boxes is the tendency for the infrared (IR) receivers to tilt backward in a set top box. Therefore, a need exists to stabilize IR receivers in modern set top boxes in a manner that does not increase the volume of the set top box and the introduction of even more components.

SUMMARY

Accordingly, the invention was devised in light of the problems described above, and an object of the invention, inter alia, is to provide an electronic device such as set top box, server or the like, with improved thermal management capabilities and a compact space efficient design. The electronic device can comprise a bottom frame portion; an information card reader over the bottom frame portion; a thermal insulation layer; a circuit board over the thermal insulation layer; a top broad heat sink over the circuit board; and a top cover over the top broad heat sink. The thermal insulation layer can include an aperture through which the information card reader is electrically connected to the circuit board. The top broad heat sink can include a planar peripheral portion surrounding one or more central depression portions in which the central depression portion or portions contact at least one heat generating component on the circuit board. The electronic device can further include a remote control receiver assembly that can be stabilized by a wall portion of the heat sink that can extend from the planar peripheral portion. The electronic device can further include the features of the bottom frame portion having a pair of vertically extending portions that have clip receiving slots on two opposing sides of the bottom frame and the top broad heat sink having a pair of opposing wall portions, wherein each opposing wall portion has two clips that snap into the clip receiving slots, thereby securing the top broad heat sink in the bottom frame. The electronic device can also include an information card reader slot formed by a gap between the bottom frame and one of the two opposing sides.

BRIEF DESCRIPTION OF THE DRAWINGS

The invention will be explained in detail with reference to embodiments, referring to the drawings, in which.

DETAILED DESCRIPTION OF THE EMBODIMENT(S)

Figure 1:
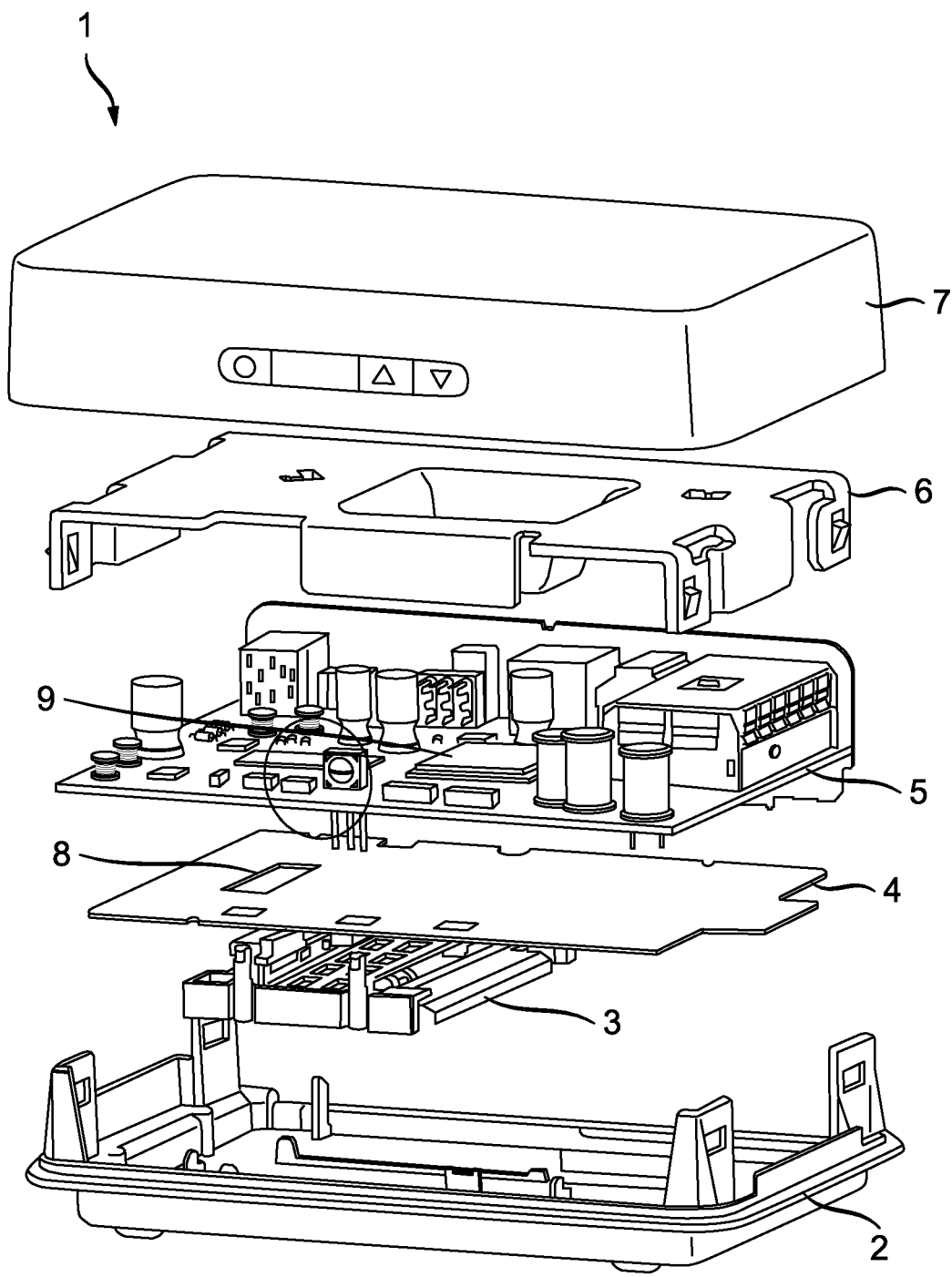
FIG. 1 is a perspective view of a disassembled set top box according to the invention.

The set top box 1 according to the invention will now be described with reference to FIG. 1. FIG. 1 is a view of the set top box 1 disassembled to show how key components can be positioned with respect to one another. In the set top box, a smart card reader 3 can be positioned under a thermal insulator or barrier 4. The thermal barrier 4 can be positioned under a printed circuit board 5 and the smart card reader 3 can be connected to the printed circuit board 5 through an aperture 8 in the thermal barrier 4. The set top box 1 can have the internal components, which include the smart card reader 3, thermal barrier 4, printed circuit board 5, and a snap-in top broad heat sink 6 on the printed circuit board 5, positioned between the bottom frame 2 and the top cover 7. The thermal barrier 4 can be a thermally insulating material that preferably has substantially the same top plan view profile as the printed circuit board 5 or a profile that is at 80% of the profile of the printed circuit board 5. Also, the top heat sink 6 can have a top plan view profile that completely covers the printed circuit board or substantially covers the circuit board such that at least above 80% of the printed circuit board 5 is covered.

Figure 2:
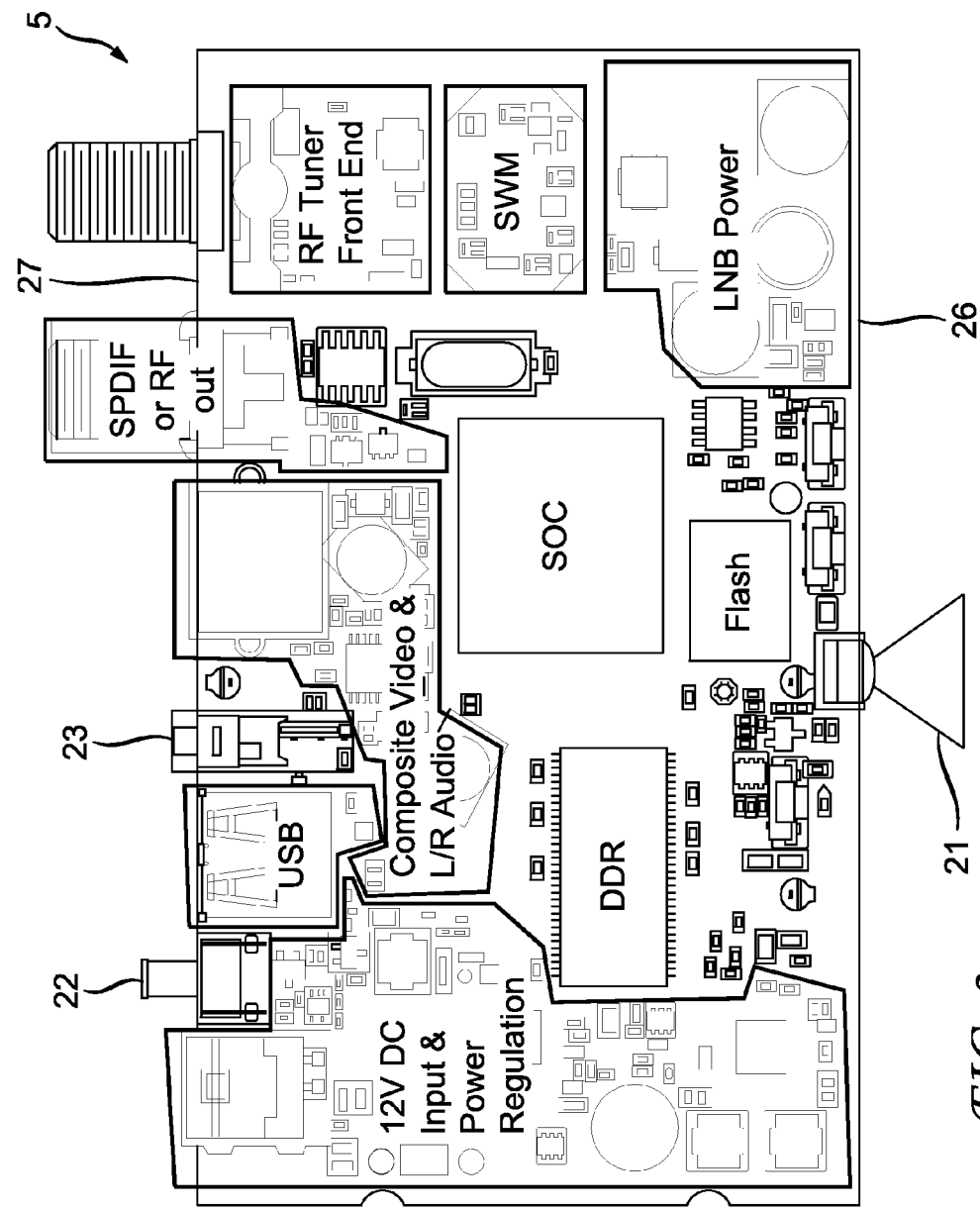
FIG. 2 is a plan view of the top side of the circuit board in the set top box according to the invention.
Figure 3:
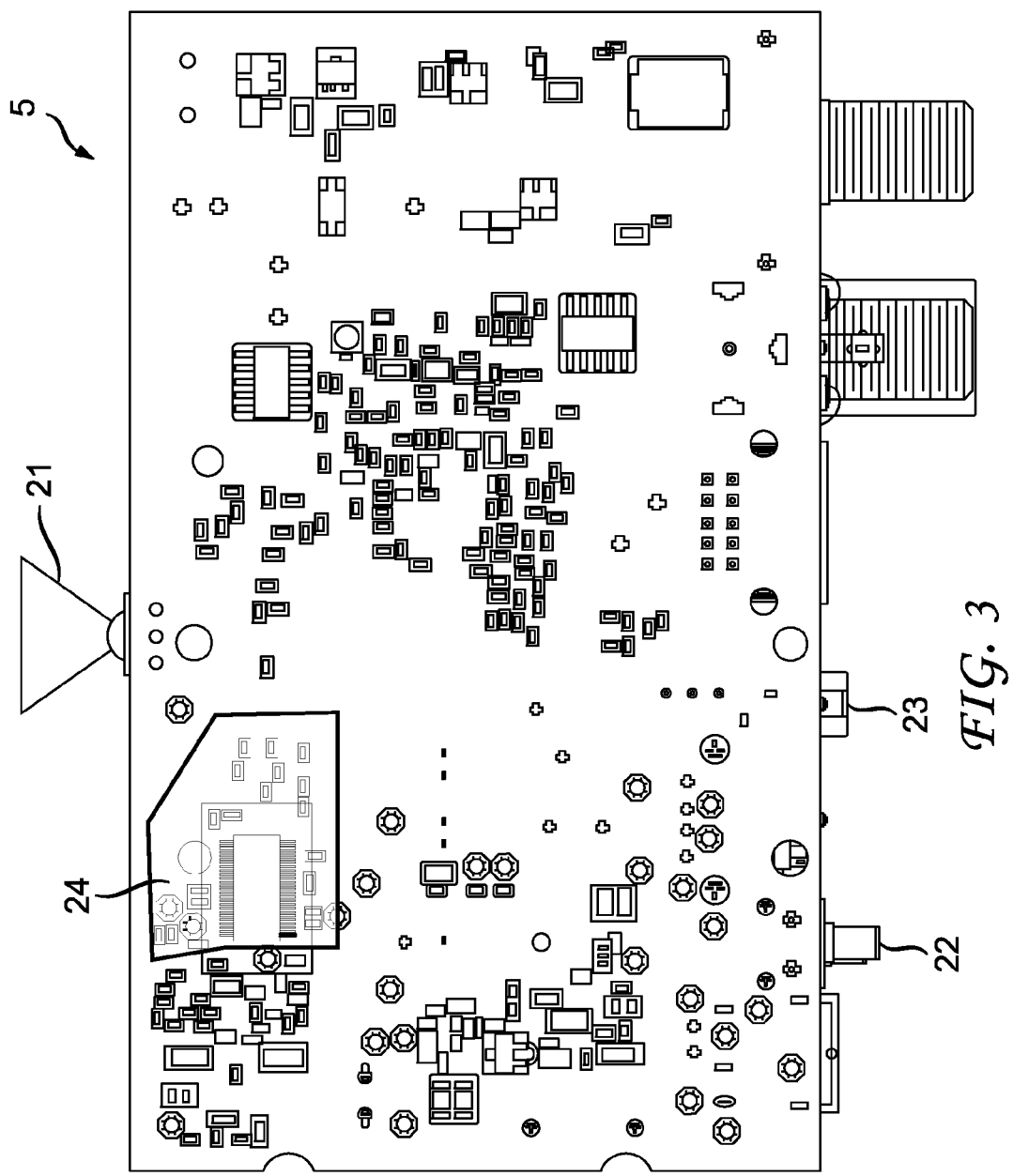
FIG. 3 is a plan view of the bottom side of the circuit board in the set top box according to the invention.
Figure 4:
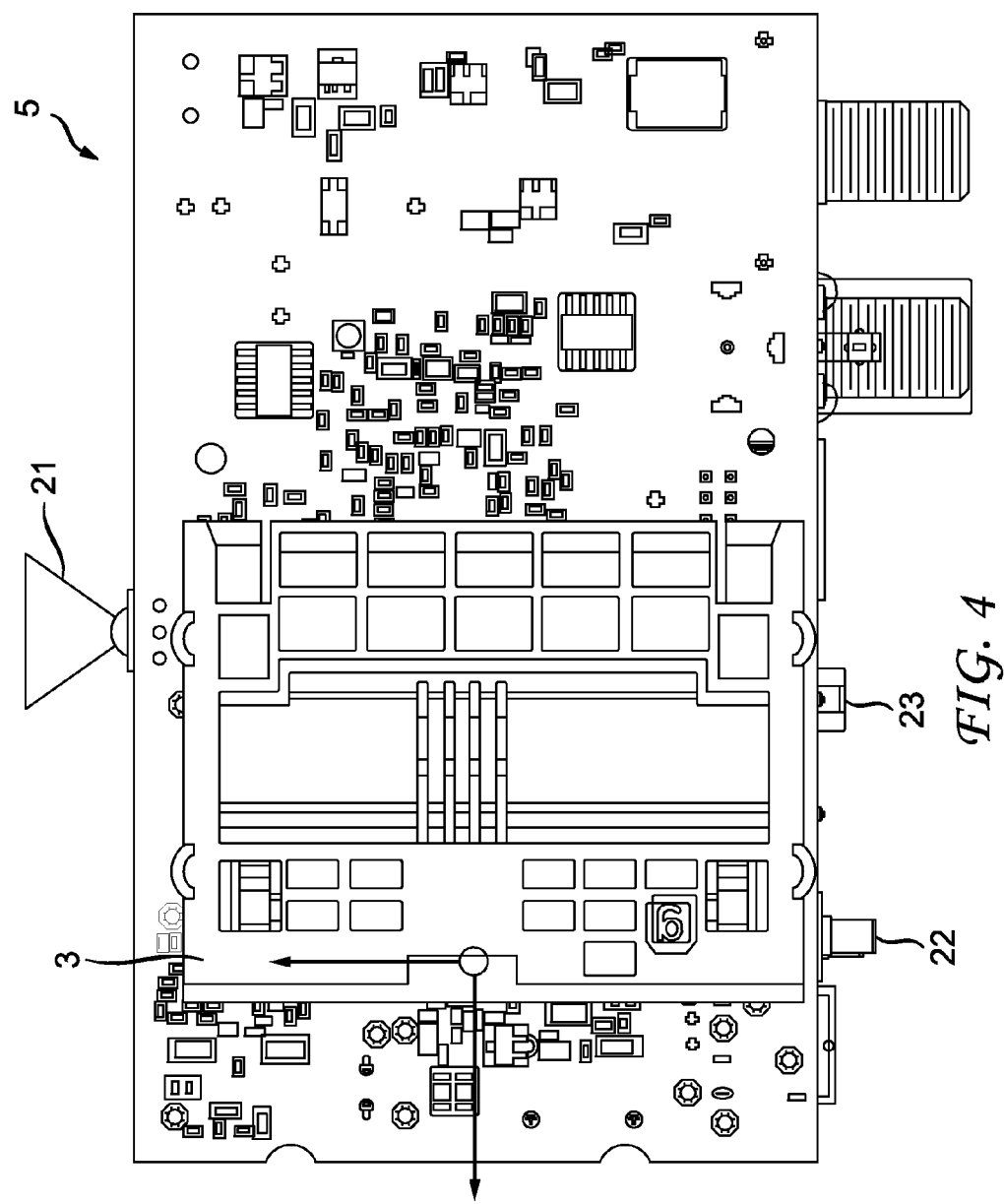
FIG. 4 is a plan view of the bottom side of the circuit board with the smart card recorder.

FIGS. 2-4 are various views of the printed circuit board 5. FIG. 2 is a plan view of the top side of the printed circuit board 5 in the set top box 1 which shows an example layout. FIG. 2 shows that the circuit board 5 can have an infrared receiver assembly 21 attached to or near the front edge 26 of the circuit board 5 and a reset switch 22 and channel ¾ selector switch attached to or near the rear edge of the circuit board 5. Although the illustration shows specific examples of circuit board components such as an IR receiver assembly 21, these components can be substituted for other components and additional components can be used. For example, the IR receiver assembly 21, which can be used for remote control purposes, could be substituted with a radiofrequency receiver assembly. FIG. 3 is a plan view of the bottom side of the circuit board 5 which shows that the circuit board 5 can include additional component such a smart card reader interface 24. FIG. 4 is another plan view of the bottom side of the circuit board in which a smart card recorder 3 is attached to the bottom of the circuit board 5. It is important to note that although the example includes a smart card reader 3, other information card readers can be used and are within the scope of the invention.

Figure 5:
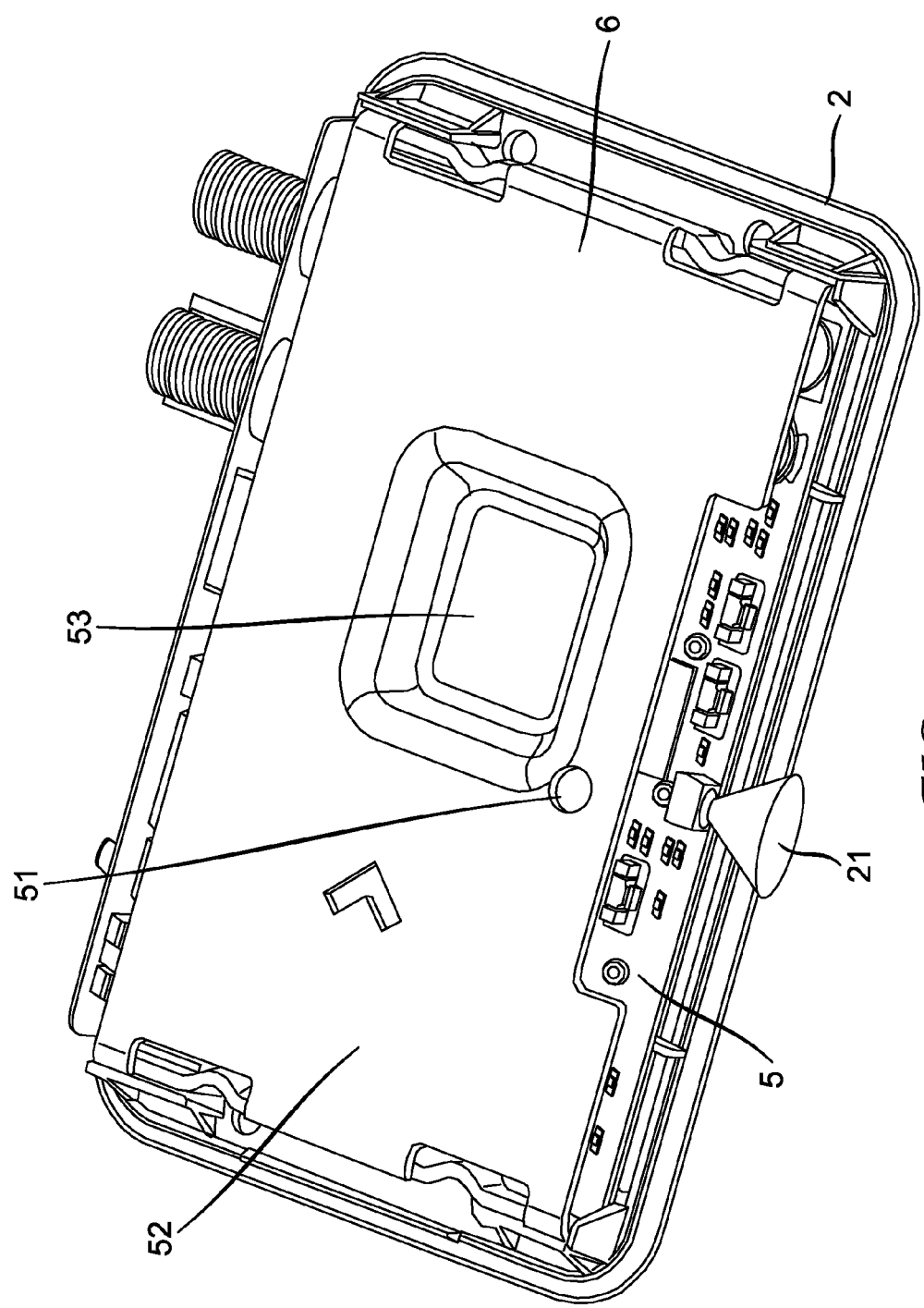
FIG. 5 is a top view of the set top box of the invention with the top cover removed.

FIG. 5 shows a top view of the interior of the set top box, illustrating access to a reset point through an access aperture 51 in the main top heat sink 6, when the reset point is on the printed circuit board 5 with the circuit board set in the bottom frame 2. In this view the IR receiver assembly 21 can be seen on the circuit board 5. The heat sink 6 is a key heat extraction feature and can include the heat sink contact 9 which is shown in FIG. 1. The top broad heat sink 6 is an effective way to cool the main integrated circuit of the set top box. The top broad heat sink 6 can be a generally contoured plate that has a generally planar periphery 52 and a contoured central feature 53 such as a pocket, central depression, notch, recess, multilevel depression, or mesa extending from and/or into a plane of the planar periphery, wherein the planar periphery preferably surrounds the central depression. In the illustrated embodiment, the planar periphery 52 surrounds 3 or 4 sides of the central depression feature 53. The central feature or central depression 53 can have side walls extending from the planar periphery and form an obtuse angle therewith. The contoured feature can optionally have a flat bottom designed to contact the main integrated circuit and/or other heat generating components on a printed circuit board 5 that contacts the heat sink contact 9.

Figure 6:
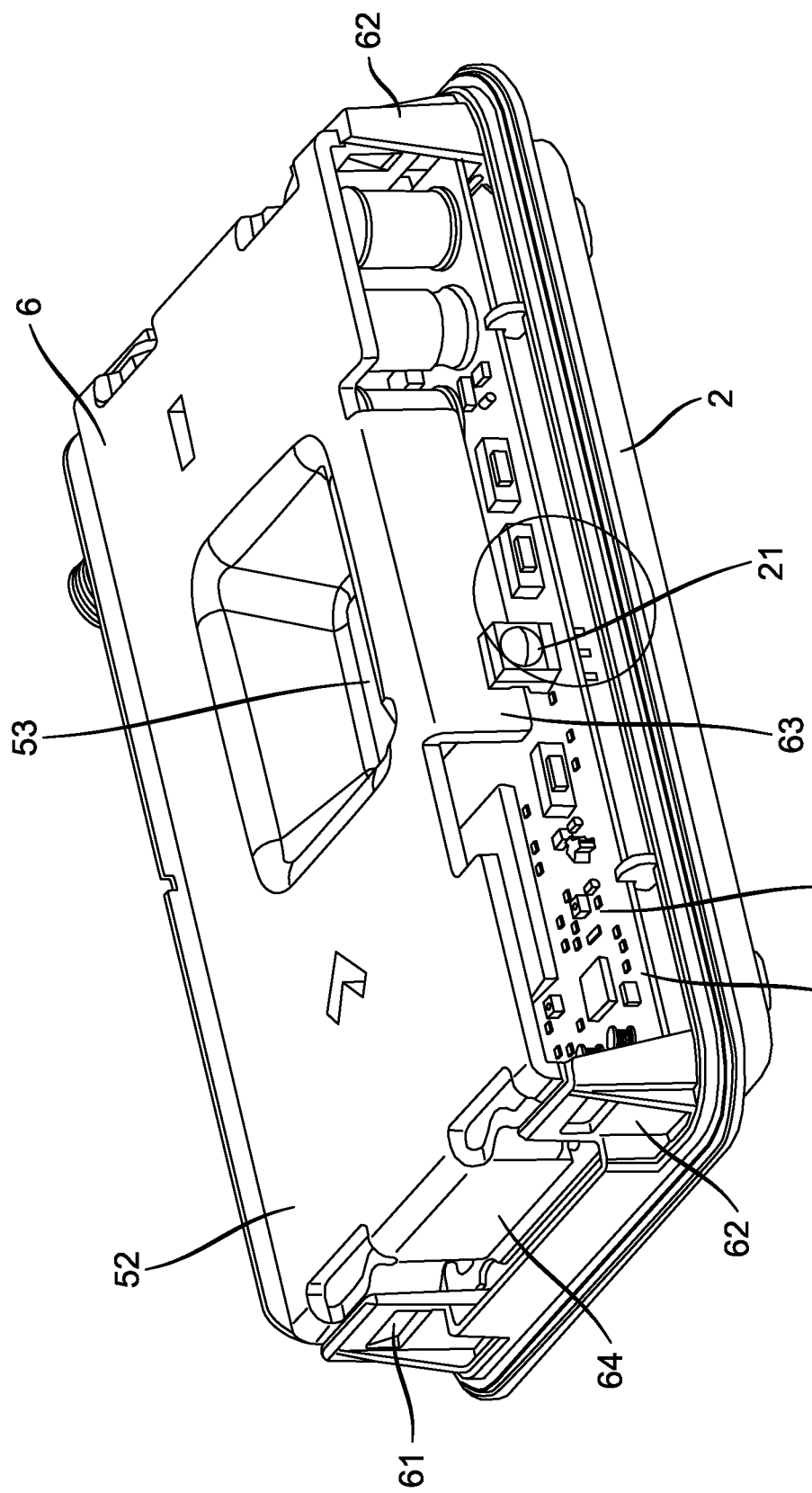
FIG. 6 is a perspective view of interior components of the set top box illustrating features of the heat sink according to the invention.

FIG. 6 is a perspective interior view of the set top box 1 which addresses the problem of the IR receiver assembly 21 being vulnerable to inadvertently tipping, bending, or otherwise being damaged. The reason for the vulnerability is the IR receiver assembly 21 generally stands vertically at the front edge 26 of the circuit board 5. To address the potential mechanical weakness of the IR receiver assembly 21, the heat sink 6 has an extension or vertical extension 63 protruding the planar periphery 52. The front surface of the vertical extension 63 contacts the back of the IR receiver assemble 21, thereby providing mechanical stability to the IR receiver assembly 21. Additionally, the vertical extension 63 which can extend downward can extend to contact the top of the circuit board 5 or other components on the circuit board 5 to further extract heat from the circuit board 5 and/or components thereon.

Additionally, the heat sink 6 can further have at least one set of opposing sides 64, which can include the vertical extension 63, perpendicular to the planar periphery 52 at the outer edges of the planar periphery 52 that extend over the printed circuit board and can contact the bottom cover or vertically extending portions of the bottom cover.

Figure 7:
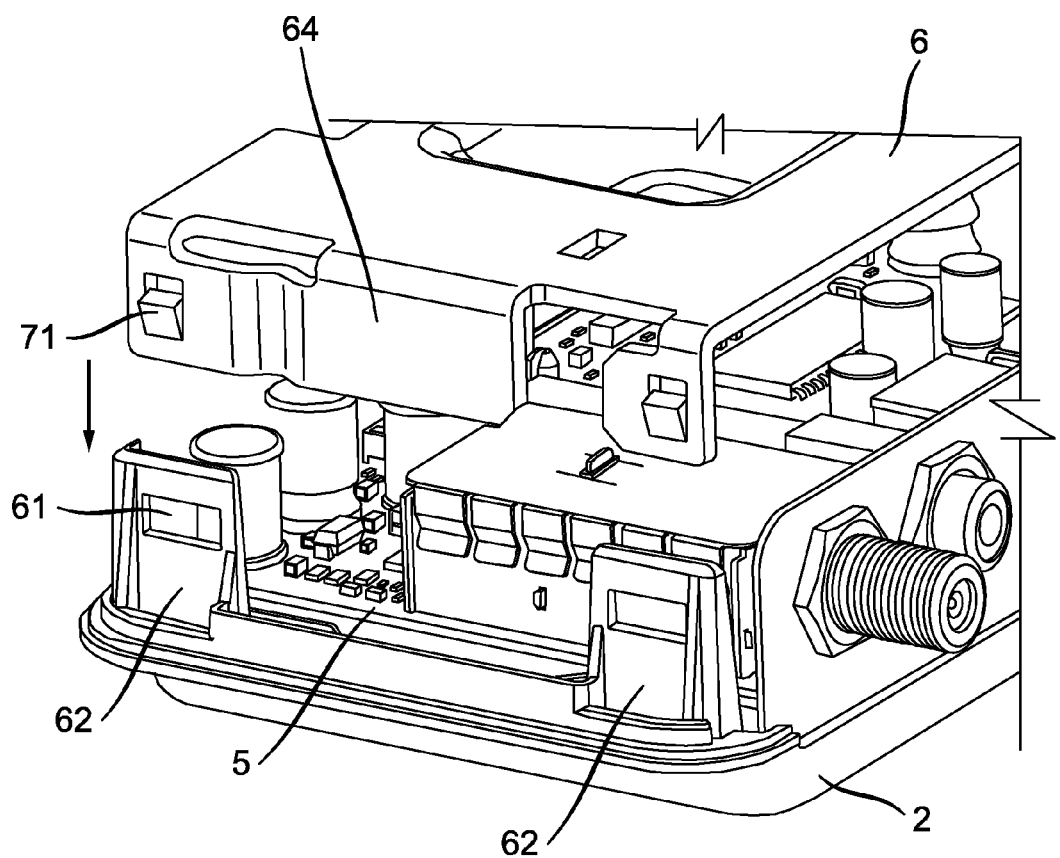
FIG. 7 is a perspective magnified view showing how the heat sink is secured to the bottom frame of the set top box.

FIGS. 6 and 7 also show how the heat sink 6 can attach to the bottom frame 2. Four vertically extending portions 62 extend from the bottom part of the bottom frame 2. The extending portions 62 can have extension receiving slots 61, which are designed to receive heat sink snaps 71 that extends from the opposing sides 64 that extend down from the planar periphery 52. The extending portions 62 can be plastic components, and as such, allows the heat sink snaps 71 to elastically snap into the slots 61, thereby securing the heat sink.

Figure 8:
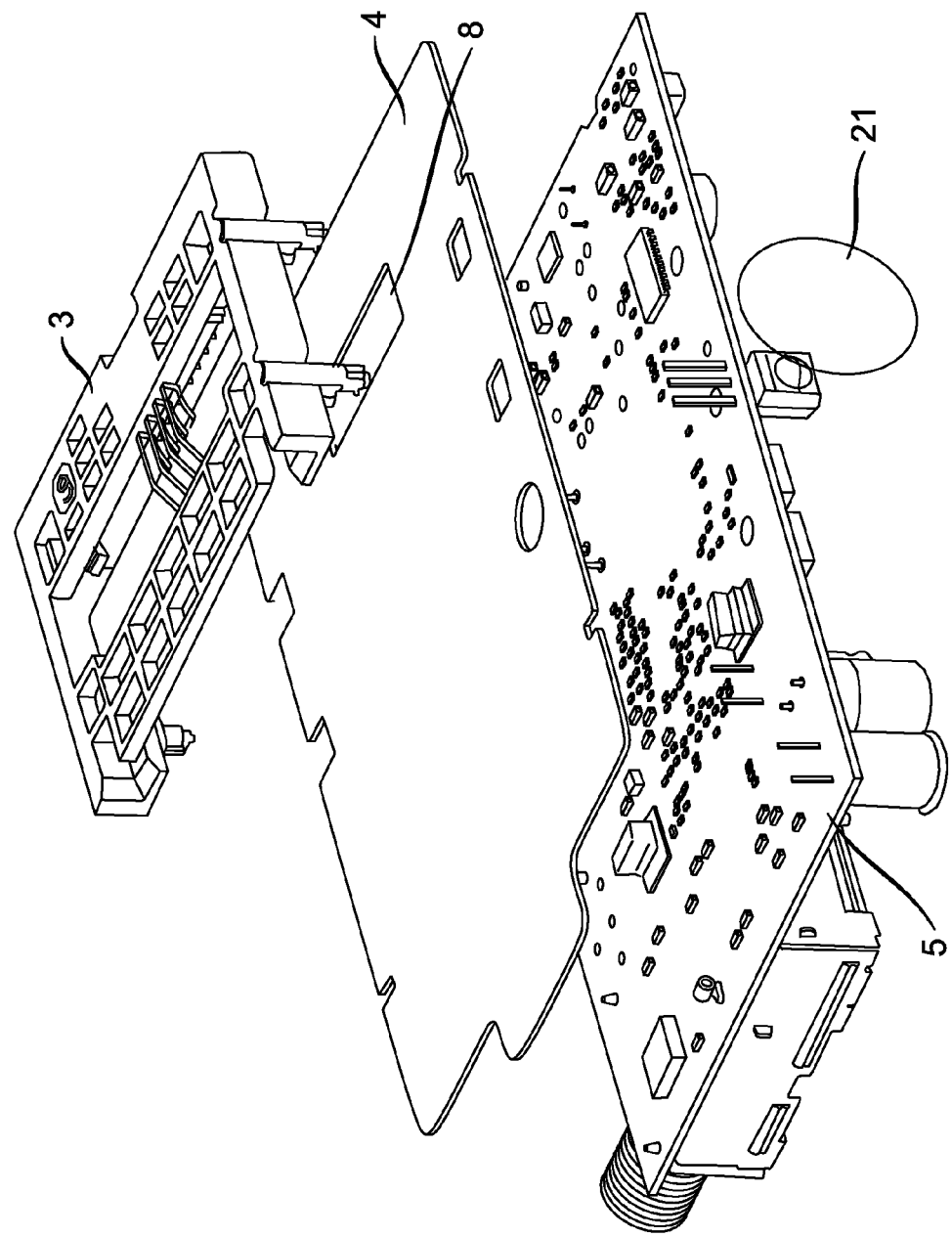
FIG. 8 is a perspective bottom view of internal components of the set top box according to the invention.

FIG. 8 shows a perspective bottom view of internal components of the set top box 1 which includes the thermal insulator (or thermal barrier) 4. The positioning of the smart card reader 3 on the bottom side of the circuit board 5 with the thermal barrier 4 between the smart card reader 3 and the circuit board 5 provides an additional heat management feature of the set top box. In fact, the thermal barrier 4 keeps the smart card reader from getting too hot by, in part, preventing heat from the circuit board 5 and components thereon from transferring to the components under the circuit board 5 such as the smart card reader 3. As shown in FIG. 1, the smart card reader 3 can be connected to the printed circuit board 5 through an aperture 8 in the thermal barrier 4.

Figure 9:
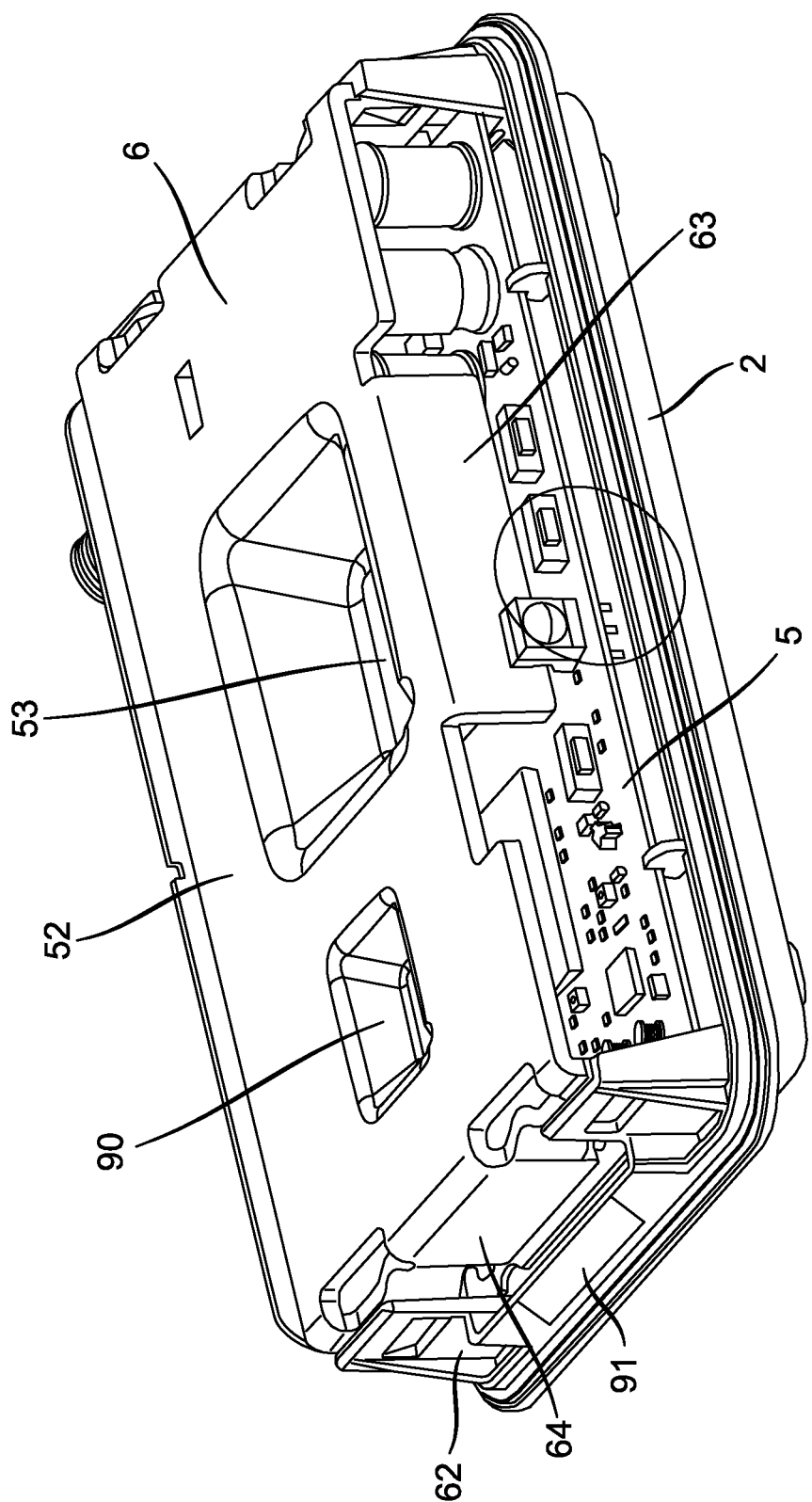
FIG. 9 is a perspective view of interior components of the set top box illustrating other embodiments of the invention.

FIG. 9 is a perspective view of interior components of the set top box highlighting other embodiments of the invention. This embodiment shows that the set top box can include a second central depression 90 that can contact a thermal pad associated with the smart card/smart card reader. Further, there can be a smart card access slot 91 which can be below the circuit board 5 and one of the opposing sides 64. The slot 91 can also be between two vertical extension portions 62 and above the bottom frame 2. The slot is shown being on a short side of the set top box, but can be positioned on other sides. The second central depression 90 can thermally communicate with the smart card reader through an aperture in the circuit board 5 (not shown) or a thermal contact through the circuit board.

Figure 10:
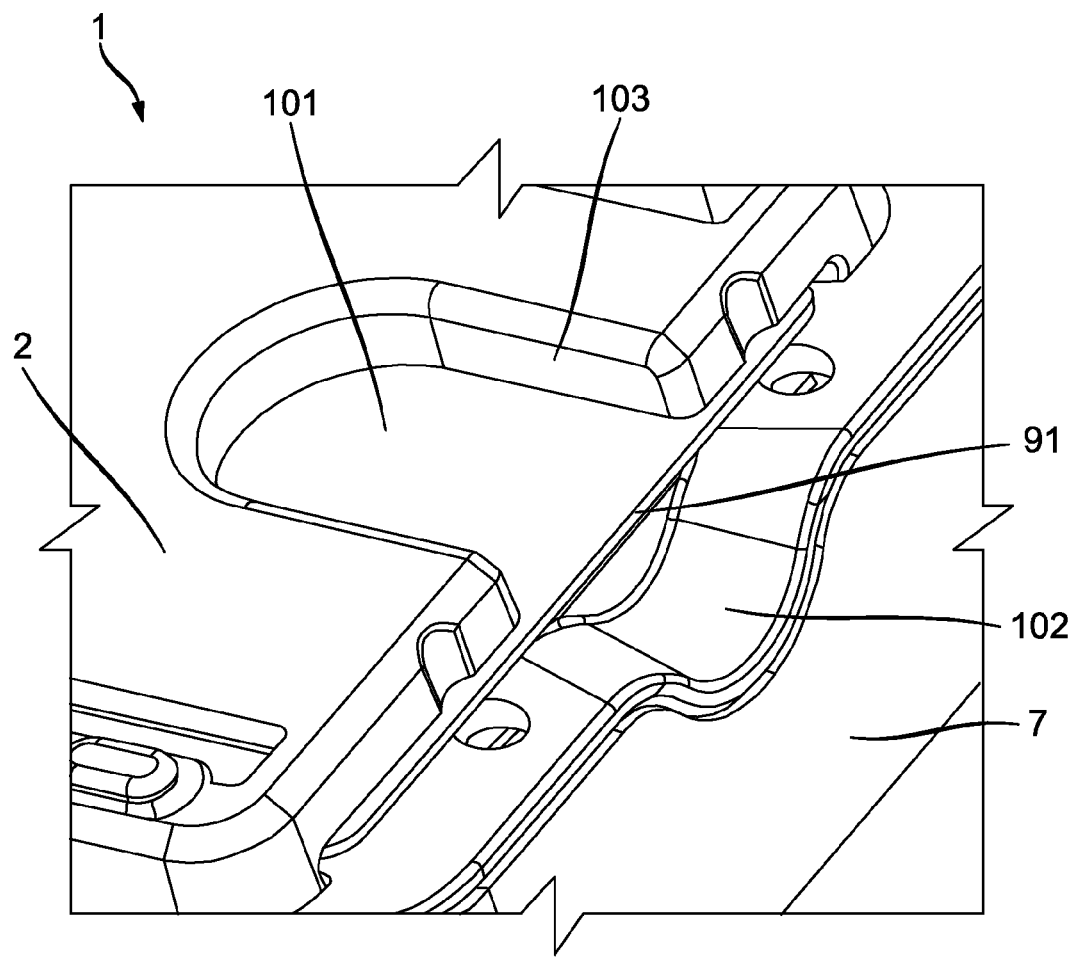
FIG. 10 shows a bottom perspective view of the set top box highlighting the smart card access.

FIG. 10 shows a bottom perspective view of the set top box 1. FIG. 10 illustrates how the smart card 101 can be inserted into or removed from the set top box 1. The smart card 101 is inserted into the smart card reader 3 through slot 91 which can be positioned on a side of the set top box. This card access region essentially includes the top cover 7 having a concave contour 102 curved toward the top of the set top to permits fingers to reach under a curved portion and over the smart card to grip the smart card 101. Additionally, the bottom frame 2 can have a complementary slot 103 on the bottom of the set top box that extends inward to permit fingers to reach under the smart card 101 to grip the smart card.

It should be understood that the drawings are for purposes of illustrating the concepts of the disclosure and are not necessarily the only possible configurations for illustrating the disclosure. For example, although the examples are mentioned with regard to a set top box and smart cards, the invention is applicable to other electronics devices having hard drives and these other devices can have types of information cards other than smart cards. Additionally, the heat sink could be hard mounted, welded or soldered in place.

The invention claimed is:

1. An electronic device comprising:
   a bottom frame portion;
   an information card reader over the bottom frame portion;
   a thermal insulation layer over the information card reader;
   a circuit board over the thermal insulation layer, wherein the thermal insulation layer has an aperture through which the information card reader is electrically connected to the circuit board;
   a top broad heat sink over the circuit board; and
   a top cover over the top broad heat sink.

2. The electronic device of claim 1 wherein the top broad heat sink has a planar peripheral portion surrounding a central depression portion, the central depression portion contacting a heat generating component on the circuit board.

3. The electronic device of claim 1 further comprising a remote control receiver assembly.

4. The electronic device of claim 3 wherein the remote control receiver assembly is an infrared receiver.

5. The electronic device of claim 3 wherein the remote control receiver assembly is a radio frequency receiver.

6. The electronic device of claim 3 wherein the top broad heat sink comprises a wall portion extending from the planar peripheral portion, the wall portion contacting the remote control receiver assembly, thereby stabilizing the remote control receiver assembly.

7. The electronic device of claim 2 wherein the top broad heat sink has a second central depression portion, the central depression portion contacting a second heat generating component on the circuit board.

8. The electronic device of claim 2 wherein
the bottom frame portion comprises a pair of vertically extending portions that have clip receiving slots on two opposing sides of the bottom frame;
the top broad heat sink has a pair of opposing wall portions, each opposing wall portion having two clips that snap into the clip receiving slots, thereby securing the top broad heat sink in the bottom frame.

9. The electronic device of claim 8 further comprising an information card reader slot formed by a gap between the bottom frame and one of the two opposing sides.

10. The electronic device of claim 1, wherein the electronic device is a set top box.

11. The electronic device of claim 1, wherein the information card reader is a smart card reader.

12. The electronic device of claim 1 further comprising a remote control receiver assembly;
wherein the top broad heat sink has a planar peripheral portion surrounding a central depression portion, the central depression portion contacting a heat generating component on the circuit board; and
wherein the top broad heat sink comprises a wall portion extending from the planar peripheral portion, the wall portion contacting the remote control receiver assembly, thereby stabilizing the remote control receiver assembly.

13. The electronic device of claim 12 wherein the top broad heat sink has a second central depression portion, the second central depression portion contacting a second heat generating component on the circuit board.

14. The electronic device of claim 13 wherein
the bottom frame portion comprises a pair of vertically extending portions that have clip receiving slots on two opposing sides;
the top broad heat sink has a pair of other opposing wall portions, each opposing wall portion having two clips that snap into the clip receiving slots, thereby securing the top broad heat sink in the bottom frame.

* * * * *